(12) United States Patent
Ma et al.

(10) Patent No.: US 7,245,057 B2
(45) Date of Patent: Jul. 17, 2007

(54) MICRO-ELECTROMECHANICAL STRUCTURE RESONATOR FREQUENCY ADJUSTMENT USING RADIANT ENERGY TRIMMING AND LASER/FOCUSED ION BEAM ASSISTED DEPOSITION

(75) Inventors: Qing Ma, San Jose, CA (US); Peng Cheng, Campbell, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/763,779

(22) Filed: Jan. 22, 2004

(65) Prior Publication Data
US 2004/0148771 A1   Aug. 5, 2004

Related U.S. Application Data

(62) Division of application No. 09/738,118, filed on Dec. 15, 2000.

(51) Int. Cl.
*H01L 41/08* (2006.01)
(52) U.S. Cl. .............. 310/312; 310/309; 310/331; 310/348; 310/363
(58) Field of Classification Search ........... 310/309, 310/311, 321, 330–332, 348, 363, 312
See application file for complete search history.

(56) References Cited

U.S. PATENT DOCUMENTS

| | | | |
|---|---|---|---|
| 2,836,737 A | 5/1958 | Crownover | |
| 3,683,213 A * | 8/1972 | Staudte | 310/312 |
| 3,766,616 A | 10/1973 | Staudte | |
| 3,913,195 A | 10/1975 | Beaver | |
| 3,940,638 A * | 2/1976 | Terayama | 310/348 |
| 3,969,640 A * | 7/1976 | Staudte | 310/312 |
| 4,012,648 A * | 3/1977 | Engdahl | 310/321 |
| 4,051,582 A | 10/1977 | Eschler et al. | |
| 4,109,359 A | 8/1978 | Cross et al. | |
| 4,131,484 A | 12/1978 | Caruso et al. | |
| 4,209,914 A | 7/1980 | Gustafsson | |
| 4,429,248 A | 1/1984 | Chuang | |
| 4,443,729 A * | 4/1984 | Rider | 310/330 |
| 5,185,055 A | 2/1993 | Temple et al. | |
| 5,696,491 A * | 12/1997 | White et al. | 340/657 |
| 5,913,244 A * | 6/1999 | Heinouchi | 73/662 |

(Continued)

FOREIGN PATENT DOCUMENTS

EP   1468960 A2 * 10/2004

(Continued)

OTHER PUBLICATIONS

Martin, S. J. et al., "Polymer Film Characterization Using Quarts Resonators," IEEE Proceedings 1991 Ultrasonics Symposium, vol. 1, Dec. 1991, pp. 393-398.

(Continued)

*Primary Examiner*—Thomas M. Dougherty
(74) *Attorney, Agent, or Firm*—Blakely, Sokoloff, Taylor & Zafman LLP

(57) ABSTRACT

The invention relates to a microbeam oscillator. Tuning of the oscillator is carried out by addition or subtraction of material to an oscillator member in order to change the mass of the oscillator member.

8 Claims, 16 Drawing Sheets

U.S. PATENT DOCUMENTS

| | | | | |
|---|---|---|---|---|
| 5,920,422 | A | * | 7/1999 | Kim .......................... 359/295 |
| 6,094,289 | A | * | 7/2000 | Moranski et al. ........... 359/223 |
| 6,126,311 | A | * | 10/2000 | Schuh ......................... 374/21 |
| 6,189,367 | B1 | * | 2/2001 | Smith et al. ............... 73/19.03 |
| 6,249,074 | B1 | * | 6/2001 | Zimnicki et al. ........... 310/312 |
| 6,307,447 | B1 | * | 10/2001 | Barber et al. ............... 333/189 |
| 6,359,371 | B1 | | 3/2002 | Perkins et al. |
| 6,437,667 | B1 | * | 8/2002 | Barber et al. ............... 333/188 |
| 6,441,702 | B1 | * | 8/2002 | Ella et al. ................... 333/188 |
| 6,448,622 | B1 | * | 9/2002 | Franke et al. ............... 257/415 |
| 6,545,386 | B2 | * | 4/2003 | Nakafuku ................... 310/312 |
| 6,566,617 | B1 | | 5/2003 | Suzuki et al. |
| 6,600,323 | B2 | * | 7/2003 | Kieres et al. ............... 324/458 |
| 6,700,312 | B2 | * | 3/2004 | Iizuka et al. ................ 310/364 |
| 6,722,206 | B2 | * | 4/2004 | Takada ........................ 73/779 |
| 6,753,639 | B2 | * | 6/2004 | Ma et al. .................... 310/309 |
| 6,924,582 | B2 | * | 8/2005 | Shimizu et al. ............. 310/312 |
| 6,943,484 | B2 | * | 9/2005 | Clark et al. ................. 310/334 |
| 2002/0074897 | A1 | * | 6/2002 | Ma et al. .................... 310/311 |
| 2002/0158702 | A1 | * | 10/2002 | Tikka et al. ................. 332/100 |
| 2004/0251781 | A1 | * | 12/2004 | Bouche et al. .............. 310/324 |

FOREIGN PATENT DOCUMENTS

| | | | |
|---|---|---|---|
| JP | 58-47311 | | 3/1983 |
| JP | 60-242800 | A | 12/1985 |
| JP | 1-198284 | | 8/1989 |
| JP | 1-315279 | | 12/1989 |
| JP | 06-204778 | A | 7/1994 |
| JP | 2004-80468 | A * | 3/2004 |

OTHER PUBLICATIONS

Application No. 09/738,118, Filing date Dec. 15, 2000, Qing Ma et al., "A Process of Making A Micro-Electromechanical Structure Resonator With Frequency Adjustment," Office Action mailed Jun. 15, 2004. (42P10077).

Application No. 09/738,118, Filing date Dec. 15, 2000, Qing Ma et al., "A Process of Making A Micro-Electromechanical Structure Resonator With Frequency Adjustment," Office Action mailed Dec. 17, 2004. (42P10077).

Application No. 09/738,118, Filing date Dec. 15, 2000, Qing Ma et al., "A Process of Making A Micro-Electromechanical Structure Resonator With Frequency Adjustment," Office Action mailed Nov. 30, 2005. (42P10077).

Application No. 09/738,118, Filing date Dec. 15, 2000, Qing Ma et al., "A Process of Making A Micro-Electromechanical Structure Resonator With Frequency Adjustment," Office Action mailed Jun. 1, 2006. (42P10077).

Application No. 09/738,118, Filing date Dec. 15, 2000, Qing Ma et al., "A Process of Making A Micro-Electromechanical Structure Resonator With Frequency Adjustment," Office Action mailed Oct. 6, 2006. (42P10077).

Application No. 10/386,062, Filing date Mar. 10, 2003, Qing Ma et al., "Micro-Electromechanical Structure Resonator Frequency Adjustment Using Radiant Energy Trimming and Laser/Focused Ion Beam Assisted Deposition," Office Action mailed Sep. 15, 2003. (42P10077D).

Application No. 10/386,062, Filing date Mar. 10, 2003, Qing Ma et al., "Micro-Electromechanical Structure Resonator Frequency Adjustment Using Radiant Energy Trimming and Laser/Focused Ion Beam Assisted Deposition," Office Action mailed Dec. 4, 2003. (42P10077D).

Application No. 10/804,897, Filing date Mar. 19, 2004, Qing Ma et al., "Process for Tuning an Oscillator," Office Action mailed Dec. 13, 2005. (42P10077D3).

Application No. 10/804,897, Filing date Mar. 19, 2004, Qing Ma et al., "Process for Tuning an Oscillator," Office Action mailed Oct. 5, 2006. (42P10077D3).

* cited by examiner

MICRO-ELECTROMECHANICAL STRUCTURE RESONATOR FREQUENCY ADJUSTMENT USING RADIANT ENERGY TRIMMING AND LASER/FOCUSED ION BEAM ASSISTED DEPOSITION

CROSS-REFERENCE TO RELATED APPLICATIONS

This application is a divisional of U.S. patent application Ser. No. 09/738,118, filed on Dec. 15, 2000, and claims priority therefrom under 35 U.S.C. § 120. The priority application is currently pending.

BACKGROUND OF THE INVENTION

1. Field of the Invention

The present invention relates generally to micro electromechanical structure (MEMS) fabrication and, more specifically, the present invention relates to the fabrication of a high frequency beam resonator. In particular, the present invention relates to frequency adjustment of the high frequency beam resonator.

2. Description of Related Art

As microelectronic technology progresses, the need has arisen for smaller and higher frequency resonators for both signal filtering and signal generating purposes among others. The prior state of the art used discrete crystals or devices that generate a surface acoustical wave (SAW) for their desired functions. As miniaturization of devices progresses, the discrete crystals and SAW generating devices become relatively larger and therefore much more difficult to package. For example, discrete devices limit the size of the overall system to larger configurations and they are more expensive to produce and to install.

Once a resonator is fabricated, process variances may cause a given resonator to have a frequency that is not within preferred range for a given application. For such out-of-range resonators, if another use therefor cannot be found, the resonator must be discarded as a yield loss.

What is needed is a MEMS resonator that overcomes the problems in the prior art.

BRIEF DESCRIPTION OF THE DRAWINGS

In order that the manner in which the above-recited and other advantages of the invention are obtained, a more particular description of the invention briefly described above will be rendered by reference to specific embodiments thereof, which are illustrated, in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
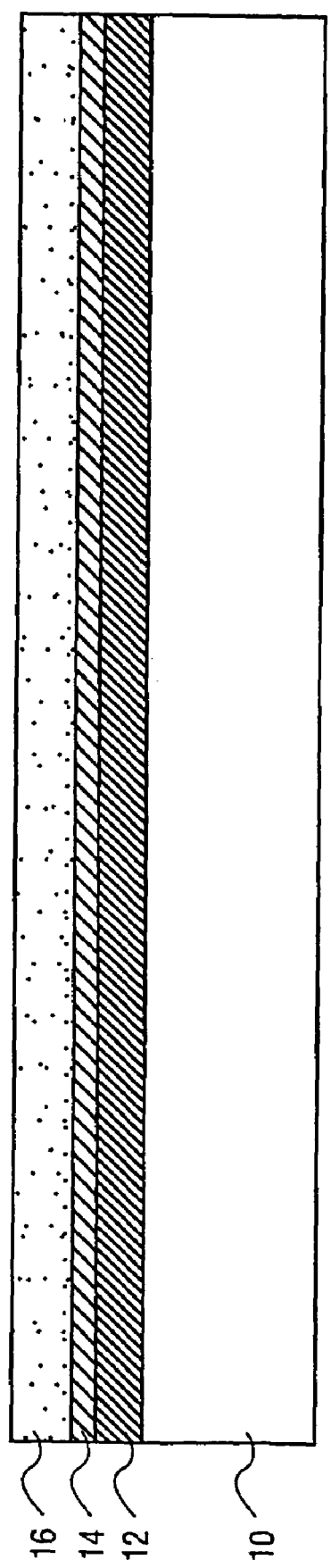
FIG. 1 is an elevational cross-section view that depicts preliminary fabrication of a MEMS resonator beam according to the present invention.

In a first embodiment, a process of forming a resonator is carried out by removing discrete amounts of material until a preferred resonant frequency is established. FIG. 1 is an elevational cross-section view that depicts preliminary fabrication of a micro electromechanical system (MEMS) resonator beam according to the present invention. A substrate 10 is depicted that, in one non-limiting example is a P-type silicon substrate that has a high sheet resistance as is known in the art. Upon substrate 10 a pad oxide 12 is formed that may have a thickness in a range from about 5,000 Å to about 15,000 Å, and preferably about 10,000 Å according to this embodiment. Upon pad oxide 12 a silicon nitride layer 14 is formed. Silicon nitride layer 14 may be $Si_xN_y$, such as $Si_3N_4$ or it may be in other stoichiometric or solid solution ratios. In this embodiment, silicon nitride layer 14 may be in a thickness range from about 500 Å to about 1,500 Å, preferably about 1,000 Å. Silicon nitride layer 14 may be formed by deposition such as physical vapor deposition (PVD) or by chemical vapor deposition (CVD). Preferably, silicon nitride layer 14 is formed by low pressure. CVD (LPCVD) under conditions that are known in the art. Upon silicon nitride layer 14 a first polysilicon layer 16 is formed. First polysilicon layer 16 may be formed by CVD, preferably LPCVD under conditions that are known in the art. First polysilicon layer 16 may be in a thickness range from about 2,000 Å to about 4,000 Å, preferably about 3,000 Å according to this embodiment. Electrical conductivity in first polysilicon layer 16 may be achieved by ion implantation in order to obtain a preferred sheet resistance. Alternatively, doping may be in situ during CVD or LPCVD formation of first polysilicon layer 16.

Figure 2:
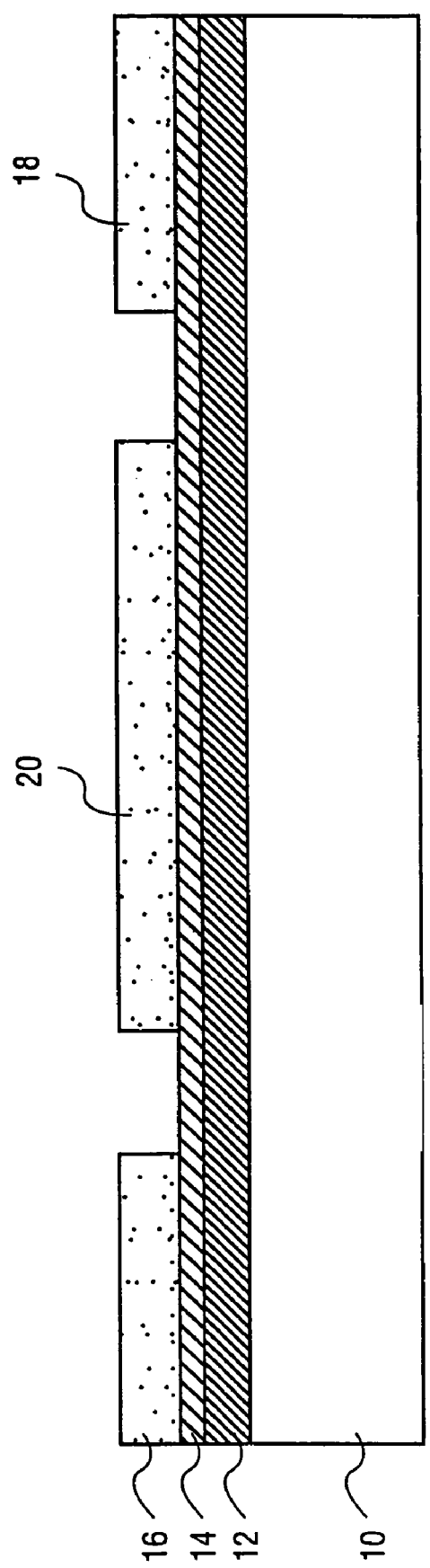
FIG. 2 is an elevational cross-section view of the resonator beam structure depicted in FIG. 1 after further processing.

FIG. 2 illustrates the result of a first mask process to define a bottom electrode. First polysilicon layer 16 has been segmented into pedestals 18 and a bottom electrode 20, also referred to as the drive electrode 20. Where the first mask process uses an organic resist, removal of the resist may be carried out by use of an aqueous sulfuric acid ($H_2SO_4$) and hydrogen peroxide ($H_2O_2$) solution as is known in the art.

Figure 3:
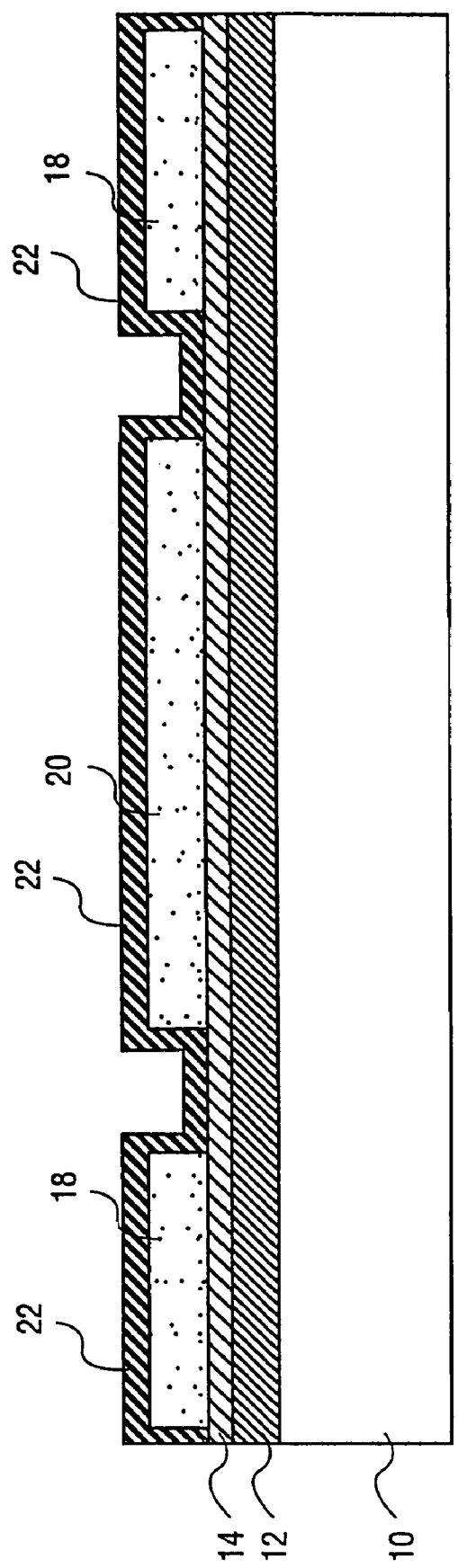
FIG. 3 illustrates further processing of the structure depicted in FIG. 2.

FIG. 3 illustrates the formation of a sacrificial oxide layer 22. Sacrificial oxide layer 22 acts to support what will be an oscillator member. A deposition process such as the decomposition of tetra ethyl ortho silicate (TEOS) may be used, or other oxide depositions known in the art. In this embodiment the thickness of sacrificial oxide layer 22 may be in a range from about 50 Å to about 1,000 Å.

Figure 4:
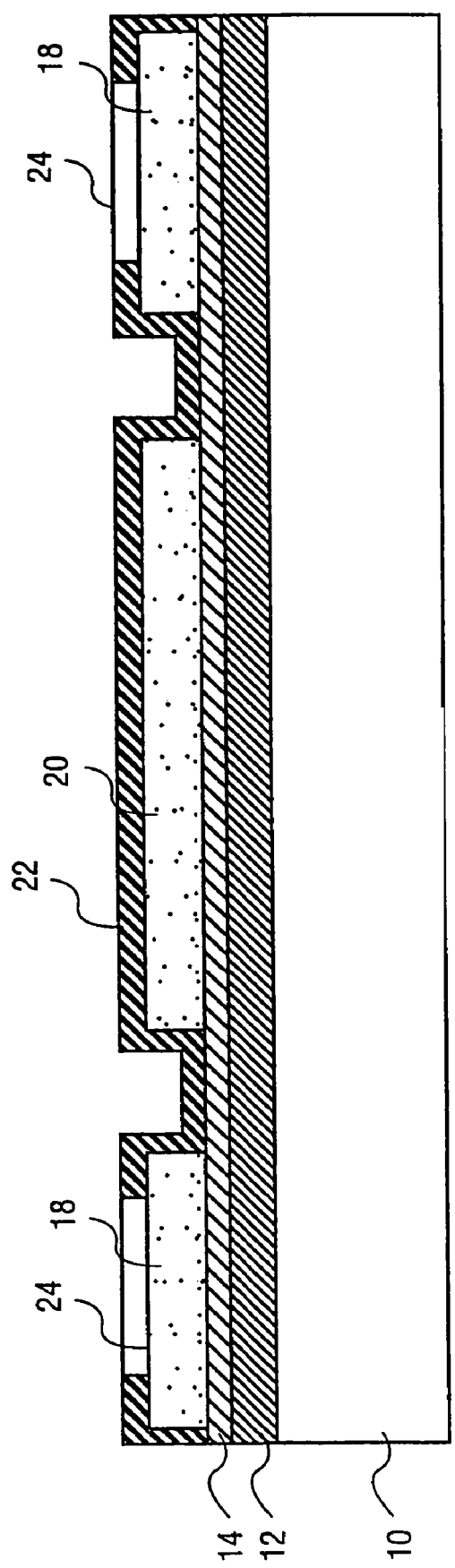
FIG. 4 illustrates further processing of the structure depicted in FIG. 3.

FIG. 4 illustrates the effect of patterning with a second mask. This process exposes part of pedestal 18 that is used as anchorage to what will become an oscillator member. In one variation of this embodiment, where sacrificial oxide layer is about 100 Å, an oxide dry etch is carried out to expose an upper surface 24 of pedestal 18. In another variation of this embodiment, where sacrificial oxide layer is about 300 Å, an oxide dry etch is carried out to expose an upper surface 24 of pedestal 18. Where the second mask process uses an organic resist, removal of the resist may be carried out by use of an aqueous sulfuric acid ($H_2SO_4$) and hydrogen peroxide ($H_2O_2$) solution as is known in the art.

Figure 5:
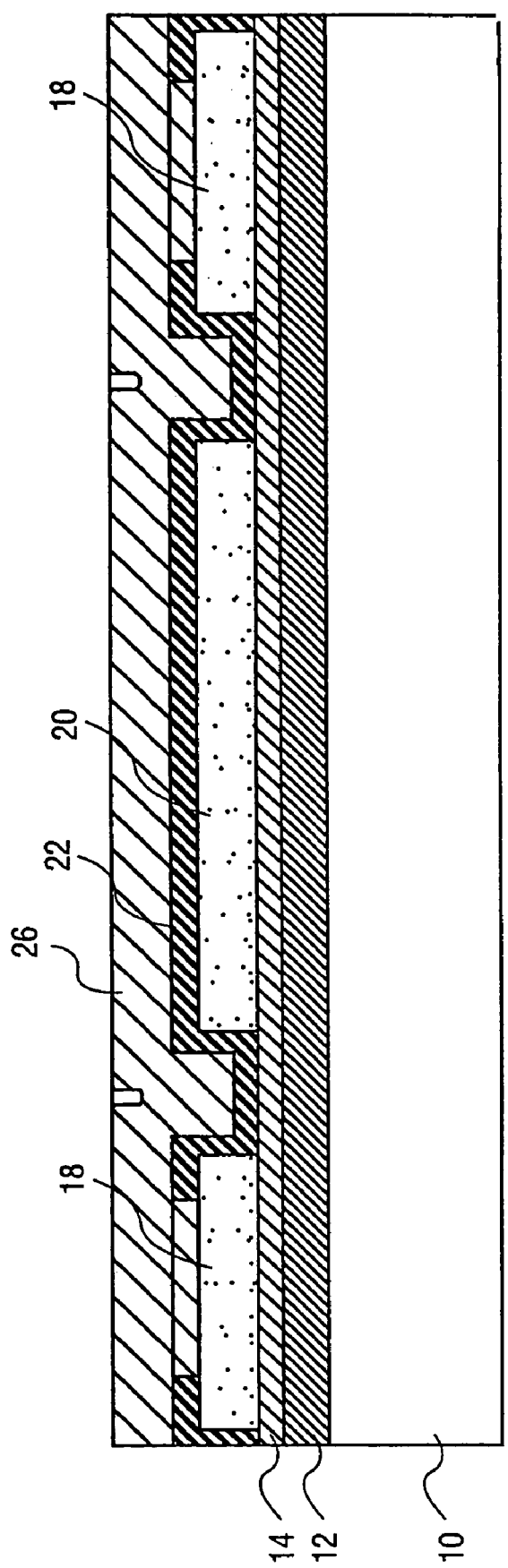
FIG. 5 illustrates further processing of the structure depicted in FIG. 4.

FIG. 5 illustrates the effect of a process that forms a second polysilicon layer 26 that deposits conformably over any topology that exists upon substrate 10. Second polysilicon layer 26 may be formed by CVD, preferably LPCVD. The thickness of second polysilicon layer will be selected based upon a preferred target frequency of the future oscillator member. In one variation of this embodiment, second polysilicon layer 26 may have a thickness in a range from about 500 Å to about 1,500 Å, and preferably about 1,000 Å. In another variation of this embodiment, second polysilicon layer 26 may have a thickness in a range from about 1,500 Å to about 4,500 Å, and preferably about 3,000 Å. In a manner similar to the ion implantation of first polysilicon layer 16, second polysilicon layer may be doped to a preferred sheet resistance that will be selected according to a specific application. Alternatively, doping may in situ during CVD or LPCVD formation of second polysilicon layer 26.

During the process flow, it may be preferred to activate any doping by a thermal treatment. In addition to dopant activation, stress relief may be achieved in the polysilicon structures. Thermal treatment may include an anneal as known in the art for doped and undoped polysilicon structures, or a faster, rapid thermal anneal (RTA) as known in the art for polysilicon structures. The specific thermal treatment may be selected according to a specific oscillator quality, both as to resistivity and to stiffness.

Figure 6:
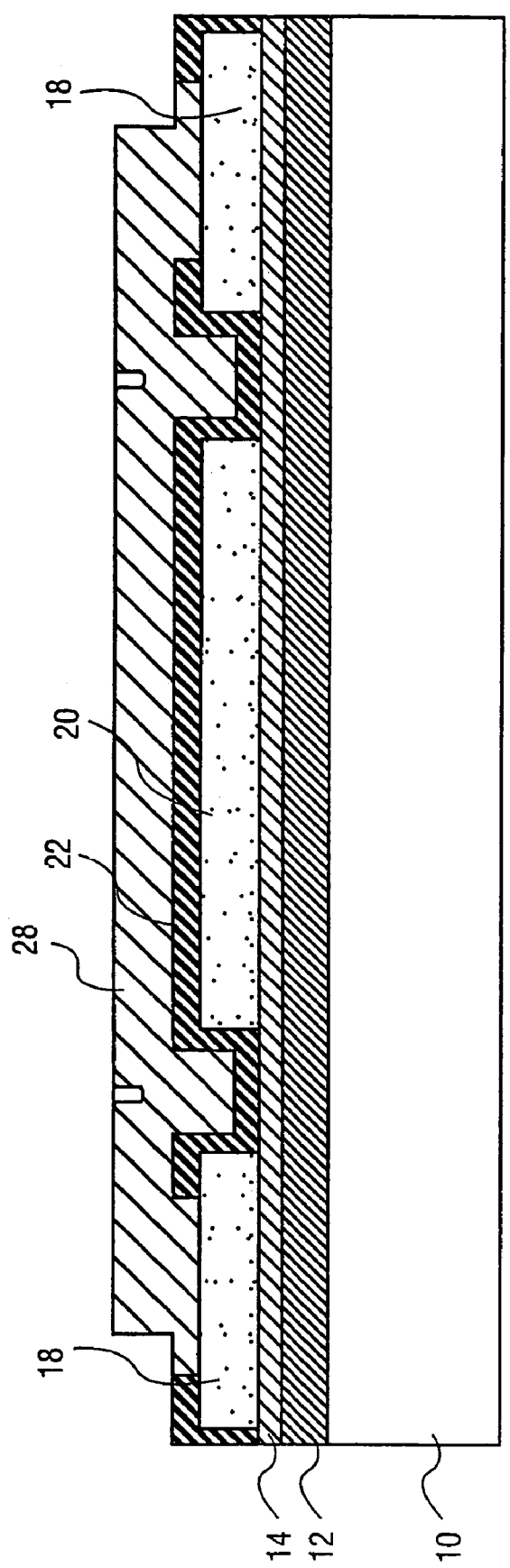
FIG. 6 illustrates further processing of the structure depicted in FIG. 5.

FIG. 6 illustrates the effect of processing with a third mask. The oscillator that is to be formed is patterned from second polysilicon layer 26. Second polysilicon layer 26 in this non-limiting embodiment, has been formed by a substantial blanket deposition of polysilicon. FIG. 6 illustrates the patterning of second polysilicon layer 26 to remove all but the oscillator member portion and the pedestal anchorage portion of second polysilicon layer 26. Accordingly, what may be referred to as an oscillator member 28 or a top electrode 28 is formed according to a process that will be further illustrated herein. Etching of second polysilicon layer 26 may be carried out under conditions known in the art. One condition is a dry anisotropic polysilicon etch that may be time dependent and/or that stops on subjacent structures such as sacrificial layer 22. Where the third mask process uses an organic resist, removal of the resist may be carried out by use of an aqueous sulfuric acid ($H_2SO_4$) and hydrogen peroxide ($H_2O_2$) solution as is known in the art.

Figure 7:
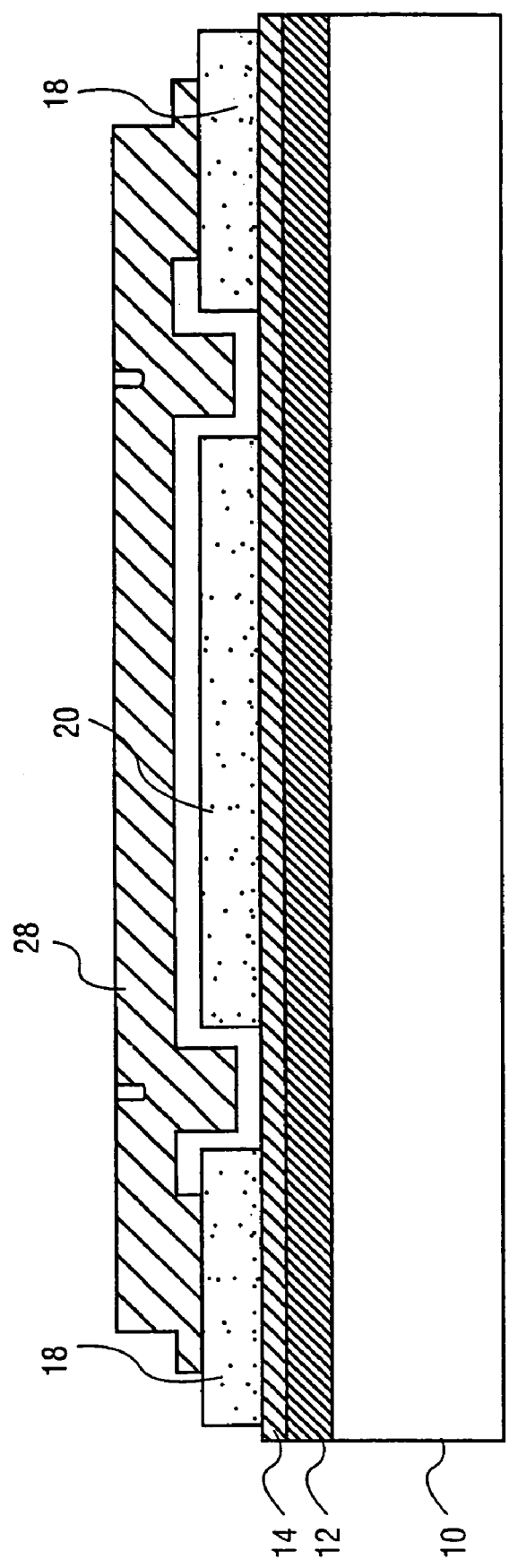
FIG. 7 illustrates further processing of the structure depicted in FIG. 6 after formation of a oscillator member layer.

After the removal of the third mask, sacrificial oxide layer 22 may be removed as depicted in FIG. 7. In one embodiment, sacrificial oxide layer 22 is wet etched in an aqueous hydrofluoric acid (HF) system. Accordingly, the HF system is selective to the polysilicon structures. Thereafter, the oscillator and substrate are allowed to dry. Drying may be thermally assisted or it may be vacuum assisted, or both as is known in the art.

Figure 8:
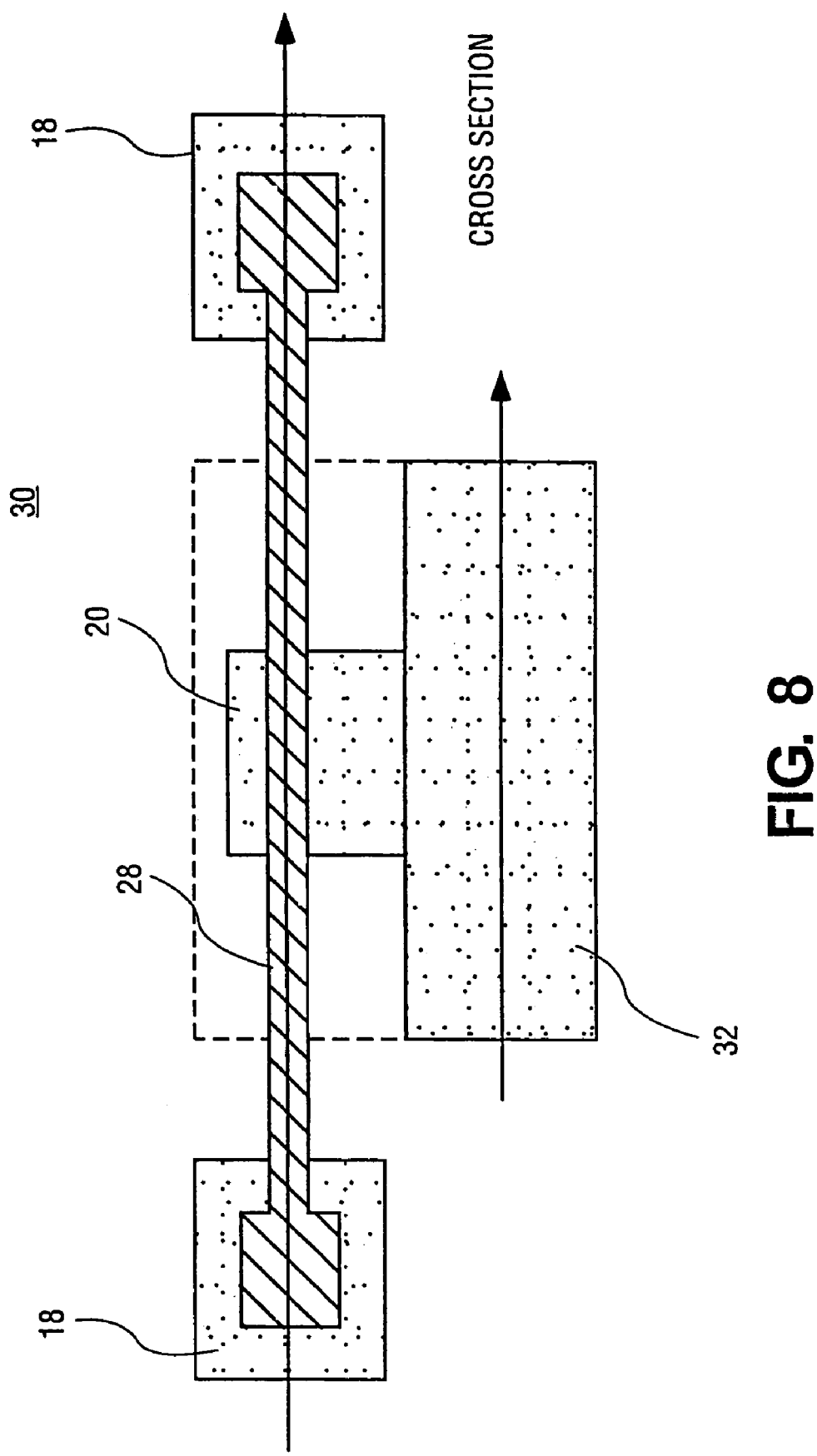
FIG. 8 illustrates a top plan view of the structure depicted in FIG. 7.

FIG. 8 is a top plan view of an oscillator bridge 30 according to the present invention. Top electrode 28 is an oscillator member that spans between two pedestals 18. It can be seen that drive electrode 20 may have a span beneath top electrode 28 that may vary in size within the dashed area. Additionally, electrical connection 32 to drive electrode comprises a segment of first polysilicon layer (FIG. 1).

Figure 9:
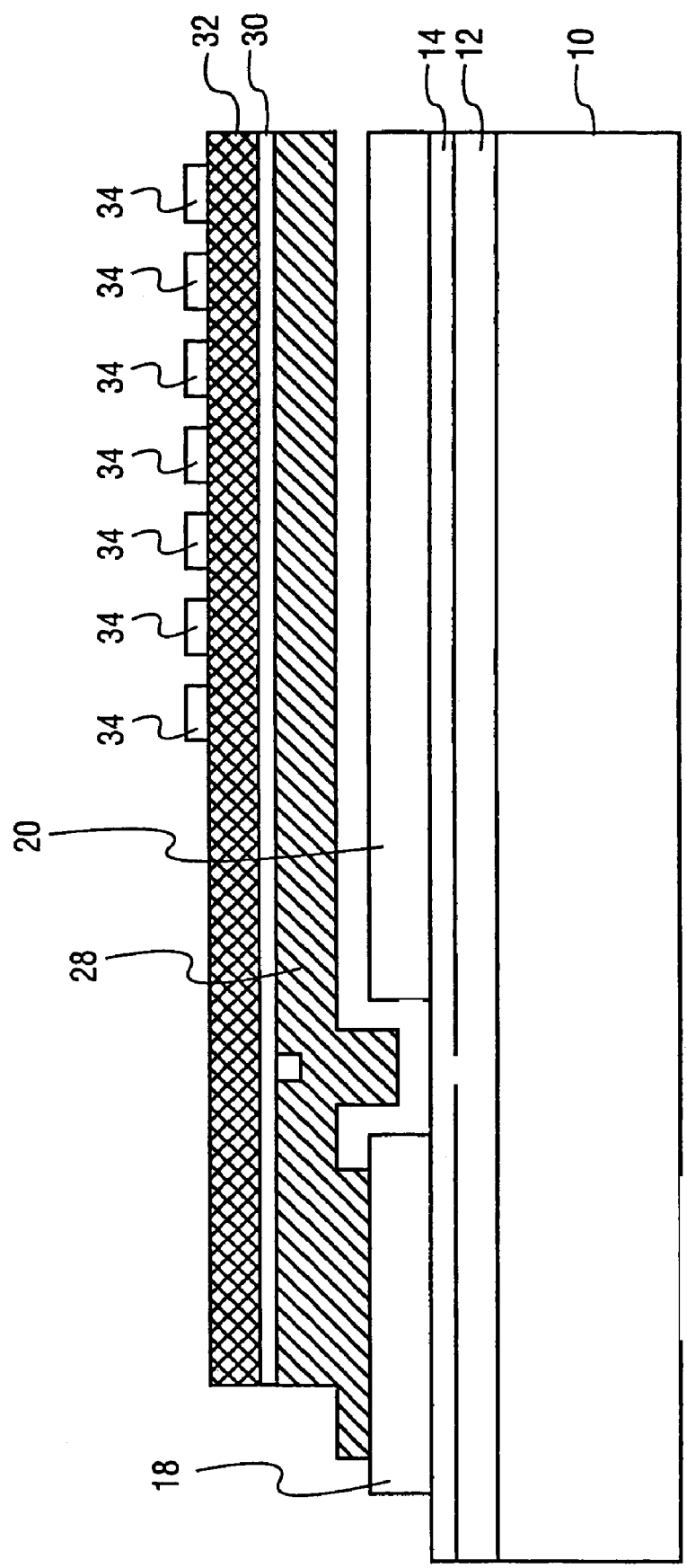
FIG. 9 illustrates an elevational cross section view of a cantilever oscillator with patterning for forming spaced apart stacks.

According to the present invention, laser tuning of the inventive oscillator may be accomplished by forming at least one structure on the oscillator. For example the at least one structure may be a plurality of spaced-apart stacks. FIG. 9 is an illustration of a cantilever beam oscillator that may be manufactured according to the present invention.

The structures of oscillator pedestal 18 and top electrode 28 may comprise an electrically conductive material. One example of an electrically conductive material is polysilicon according to the embodiment set forth herein. The polysilicon is selected from undoped polysilicon and doped polysilicon, either p-doped or n-doped. Another example of an electrically conductive material is a metal such as metals that are typically used in the fabrication of metallization layers. The metal may be selected from aluminum, copper, silver, gold, and the like. The metal may also be selected from titanium, niobium, zirconium, hafnium, and the like. The metal may also be selected from tungsten, cobalt, nickel, scandium and others known in the art. Another example of an electrically conductive material is refractory metal nitrides selected from titanium nitride, tantalum nitride, tungsten nitride, aluminum nitride, combinations thereof, and the like.

According to one embodiment, after the formation of top electrode 28, and preferably before the removal of sacrificial oxide layer 22, the entire structure may be treated to make the resonator structure an integral unit. Where pedestal 18 and top electrode 28 are polysilicon, treatment may be a rapid thermal process (RTP) such a heating in an inert environment over a temperature increase range from about 100° C. to about 2,000° C. and for a process time from about 10 seconds to about 5 minutes. In order to provide a microfine-grained, substantially homogenous polysilicon resonator structure that will resist disintegration during field use, it is preferable to use a polysilicon composition that has a grain size in a range from about 0.1 micron to about 10 micron and an aspect ratio from about 1:1 to about 4:1, preferably from about 1.1:1 to about 2:1. Preferably, the polysilicon is doped by implanting doping elements at the borders between individual homogenous phases of the polysilicon.

Where top electrode 28 and pedestal 18 are made of a metal, fabrication may be preferably carried out by sputtering. An RTP may also be carried out to anneal the composite structure. In any event, the resonant frequency of a beam, bridge or a plate/membrane is a function of both resonator stiffness and resonator mass. Accordingly, a preferred resonant frequency, a preferred oscillation frequency or the like may be achieved in part by selecting a material according to its known stiffness.

After the formation of top electrode 28, a protective layer 30 and an ablative layer 32 are formed over oscillator member 28 as depicted in FIG. 9. A fourth mask 34 is patterned over ablative layer 32 in preparation for the formation of spaced-apart stacks that may be selectively removed for oscillator tuning. Protective layer 30 may act as a diffusion barrier that may be made from materials such as titanium (Ti), chromium (Cr), silicon (Si), thorium (Th), cerium (Ce), alloys thereof, combination thereof, and the like. Metal oxide compounds may be also used such as titania, chromia, silica, thoria, and ceria. Metal nitride compounds may also be used such as $Ti_xN_y$, $Cr_xN_y$, $Si_xN_y$, $Th_xN_y$, $Ce_xN_y$, and the like. Metal silicide compounds may also be used such as $Ti_xSi_y$, $Cr_xSi_y$, $Th_xSi_y$, $Ce_xSi_y$, and the like. In any event the metal oxide, the metal nitride, and the metal silicide compounds may be provided in both stoichiometric and solid solution ratios.

Figure 10:
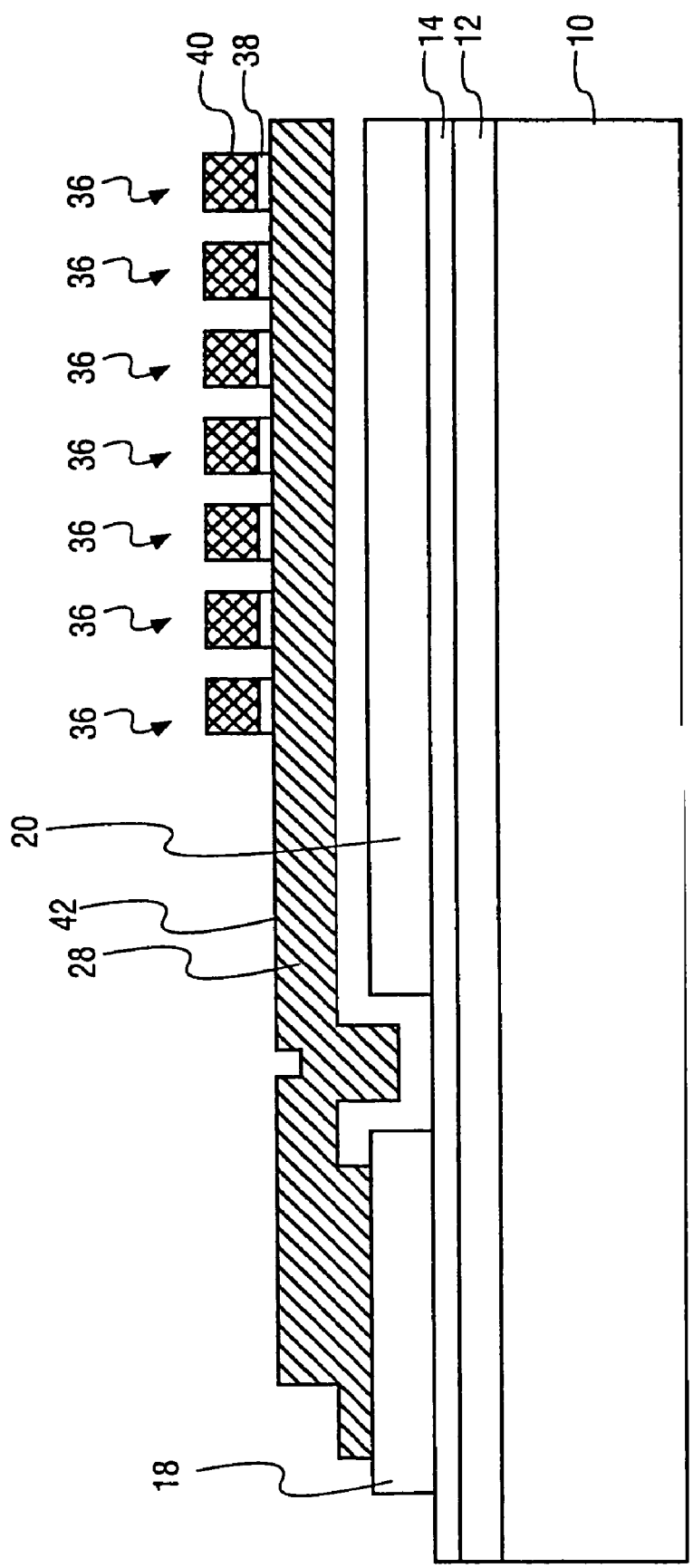
FIG. 10 is an elevational cross-section view the structure depicted in FIG. 9 after the patterning of the protective layer and an ablation layer.

FIG. 10 illustrates cantilever beam oscillator 100 after further processing. Other oscillator structures may be used such as microbridge resonators and the like as illustrated in FIG. 8 or the like, membrane resonators and the like, and other resonators. In the present invention a cantilever beam oscillator 100 is used to illustrate the inventive method. FIG. 10 illustrates cantilever beam oscillator 100 after further processing in which sacrificial oxide layer 22 has been removed. The removal process may be done by isotropic etching, preferably by wet etching. Etch selectivity in the preferable isotropic wet etch is configured to make the etch recipe less selective to sacrificial oxide layer 22, than to any and all of substrate 10, drive electrode 20, oscillator pedestal 18, and top electrode 28. The etch recipe selectivity is above about 20:1, preferably below about 100:1, more preferably below about 1000:1, and most preferably below about 5000:1. After the removal process, it is observed that top electrode 28 is disposed spaced apart from drive electrode 20. Optionally, the removal of sacrificial oxide layer 22 may precede formation of protective layer 30 and ablative layer 32, or following removal of ablative structure 40.

A plurality of spaced-apart stacks 36 include a protective pad 38 that is formed from protective layer 30, and ablative structure 40 that is formed from ablative layer 32. The spaced-apart stacks 36 are patterned upon a first surface 42 of oscillator 100. As illustrated in FIG. 10, protective pad 38 was simultaneously patterned out of protective layer 30, while ablative structure 40 was patterned out of ablative layer 32. Ablative structure 40 is preferably made from a material that will vaporize at the intensities of a focused ion beam (FIB) or a laser. Protective pad 38 acts to resist damage to upper surface 42 of oscillator member 28 during removal the ablative structure 40 of selected spaced-apart stacks 36. The material of protective pad 38 may be selected from a refractory metal, a refractory metal silicide, a refractory metal nitride, and combinations thereof. For example a refractory metal silicide may be $Ti_xSi_y$, wherein x and y are configure for both stoichiometric and other solid solution combinations. Alternatively, protective pad 38 may be selected from a silicon-based composition such as polysilicon and the like for both doped and undoped polysilicon. Other silicon-based compositions may include silicon oxide such as $Si_xO_y$ such as stoichiometric silica and the like in both stoichiometric and other solid solution combinations. Other silicon-based compositions may include silicon nitride such as $Si_xN_y$, for example $Si_3N_4$ and the like in both stoichiometric and other solid solution combinations.

Optionally, protective pad 38 may be patterned through a negative mask by patterning the mask with a plurality of recesses, and by successively lining the recesses with protective pad 38, followed by second filling the recesses with ablative material 40. Thereafter, a planarization such as chemical mechanical planarization (CMP) or the like, or a plasma etchback or the like may be carried out. In order to achieve a structure similar to that depicted in FIG. 10, the formation of protective pad 38 is preferably carried out by collimated physical vapor deposition (PVD). Alternatively, protective layer 30 may be unpatterned such that the mass thereof is figured into the ultimate frequency of oscillator 100.

Removal of selected spaced-apart stacks 36 is carried out by determining a first resonant frequency of top electrode 28 and removing at least one of the spaced-apart stacks 36 with a radiant energy source. The radiant energy source is selected from a laser and the like, an ion beam and the like, and combinations thereof. Preferably, the radiant energy source is a laser that may be used for laser ablation. By removal of the spaced-apart stack 36, it is meant that ablative structure 40 is removed according to the present invention, and that protective pad 38 may or may not be removed in whole or in part.

In one embodiment of the present invention, the removal of selected spaced-apart stacks 36, or one of them, is carried out in a passive or static implementation. In this embodiment, a first resonant frequency is determined, at least one spaced-apart stack 36 is removed, and second resonant frequency is determined by vibrating the oscillator 100 after removal of at least one spaced-apart stack 36. In another embodiment of the present invention, the removal of selected spaced-apart stacks 36, or one of them, is carried out in an active or dynamic implementation. In this embodiment, a second resonant frequency is determined by monitoring any change in resonant frequency while simultaneously removing selected spaced-apart stacks 36, one of them, or a portion thereof where radiant energy controls may be sufficiently sensitive.

Figure 11:
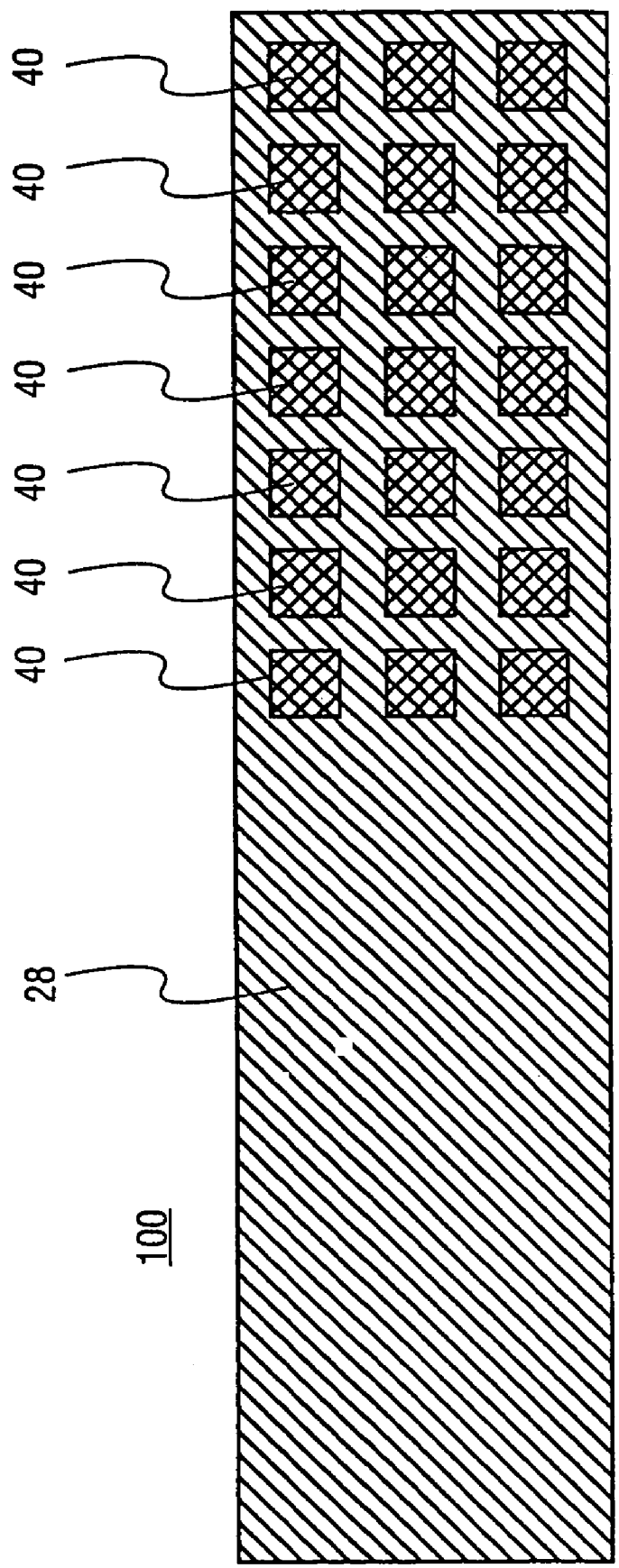
FIG. 11 is a top plan view of the inventive structure after patterning of the protective layer and an ablation layer.
Figure 12:
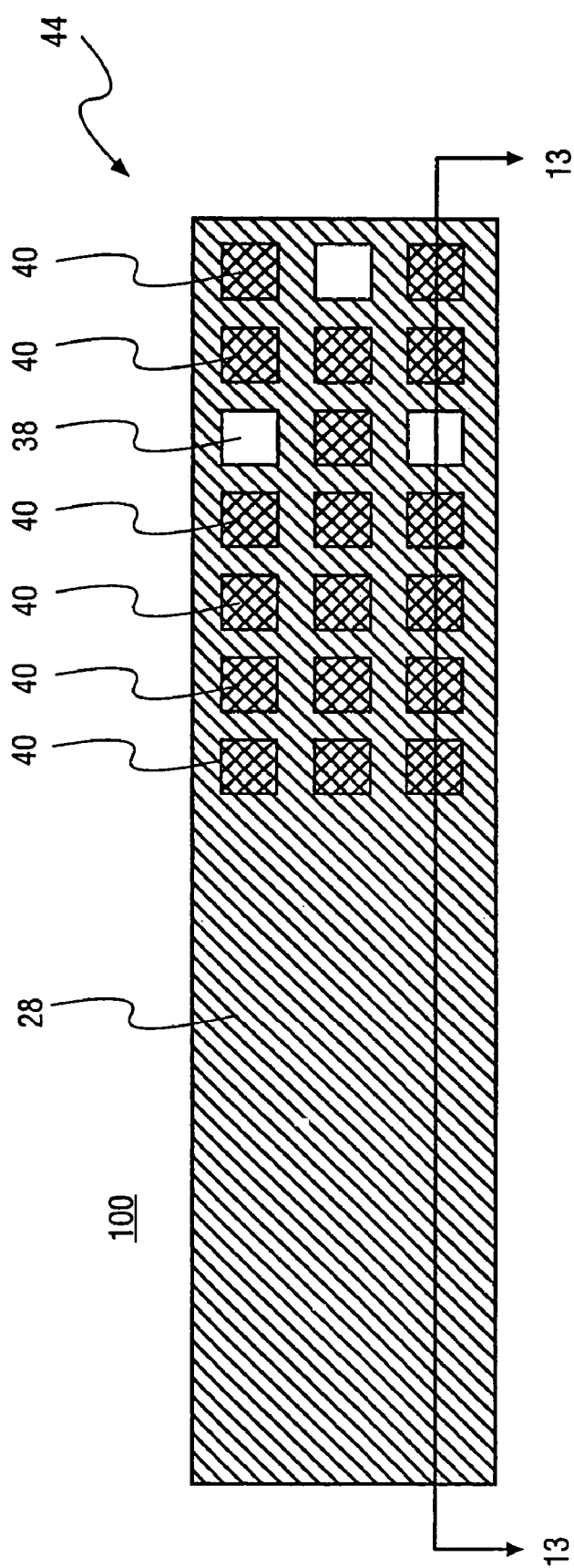
FIG. 12 is a top plan view of the structure depicted in FIG. 11 after selective removal of a number of the spaced-apart stacks.

FIG. 11 is a top plan view of the oscillator 100 depicted in FIG. 10 to illustrate a pattern formed of the ablative layer 32 and of spaced-apart stacks 36. During removal of selected spaced-apart stacks 36, or one of them, an empirical removal pattern is established upon oscillator 100. FIG. 12 is an illustration of a removal pattern 44 that may arise from combination of empirical and/or academic knowledge of a preferred configuration of spaced-apart stacks 36 that are selected for removal based upon a delta in the first resonant frequency and a preferred second resonant frequency. Empirical and/or academic knowledge may then be applied to a second resonator in the same process batch. Alternatively, the second resonator may be located in a region in a second wafer or the like that is likely to have similar process results. Alternatively, a second resonator may be located on a second wafer that may have had similar process conditions as the first resonator. Additionally, a combination of a similar process wafer and a similar region of a wafer may be combined to select the second resonator. Additionally, a progressive stepping across a given wafer may be carried out under conditions that allow for finite difference tracking of changes in the first resonant frequency, and stack removal may be adjusted in response previous empirical data obtained for the given wafer or for a previous wafer that may have been processed under similar conditions.

Figure 13:
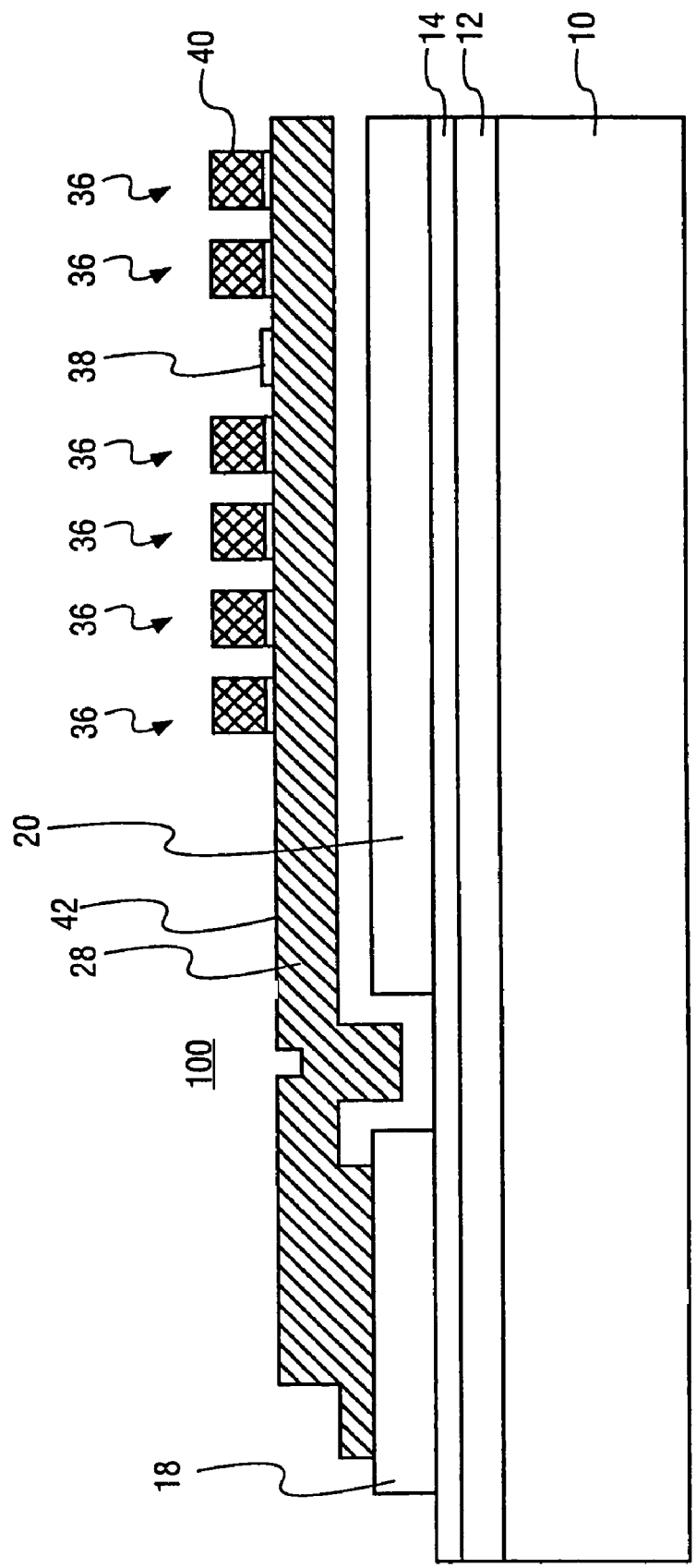
FIG. 13 is an elevational cross-section view of the structure depicted in FIG. 12, taken along the cross-section line 13—13 to illustrate the inventive process.

The final frequency of oscillator 100 is based upon the mass of remaining spaced-apart stacks 36, and a respective position of each at least one spaced-apart stack 36 along the top electrode 28 that is not removed, under conditions to approach a second resonant frequency. FIG. 13 is an elevational cross-section view taken along the line 13—13 from FIG. 12. FIG. 13 depicts the structure of oscillator 100 after removal of the ablative structure 40 of at least one spaced-apart stack 36. Preferably, removal of a spaced apart stack 36 is carried out by directing a radiant energy source toward a selected spaced-apart stack 36. Because the ablative layer is now configured as a plurality of discrete ablative structures 40 that make up spaced-apart stacks 36, a radiant energy beam that is directed toward a selected spaced-apart stack 36 has sufficient margin for a radiant beam overlap error that is limited to the area immediately surrounding a given spaced-apart stack 36, without impinging upon an adjacent spaced-apart stack 36. In this way, a substantially discrete amount of material, that is a single ablative structure 40, is removable from upper surface 42 such that substantially discrete tuning of oscillator 100 may be carried out. A preferred source of radiant energy is a laser. In the present invention, the duration and intensity of the radiant energy source is less effective to remove a discrete amount of material, compared to the removal of a discrete spaced-apart stack 36 or the ablative structure 40 portion of a spaced-apart stack 36.

In one embodiment, oscillator 100 is a beam such as a cantilever beam. For some applications such as a hand-held telecommunications use by way of non-limiting example, the mass of oscillator 100 is in the range from about $0.1 \times 10^{-7}$ gram to about $10 \times 10^{-7}$ gram. The process may be carried out in this embodiment wherein each of the spaced-apart stacks 36 has a mass in a range from about 0.02% the mass of the oscillator 100 to about 2% the mass of oscillator 100.

In one embodiment of the present invention, sacrificial oxide layer 22 is removed before the selective removal of at least one spaced-apart stack 36. In a first alternative of this embodiment, selective removal of at least one spaced-apart stack 36 is carried out in the passive or static mode wherein oscillator 100 is not being tested in motion. In a second alternative of this embodiment, selective removal of at least one spaced-apart stack 36 is carried out in the active or dynamic mode wherein oscillator 100 is being tested in motion. In either embodiment, intermittent testing of oscillator 100 may be carried out to achieve a preferred resonant frequency. In another embodiment, sacrificial oxide layer 22 is removed after the selective removal of at least one spaced-apart stack 36.

Figure 14:
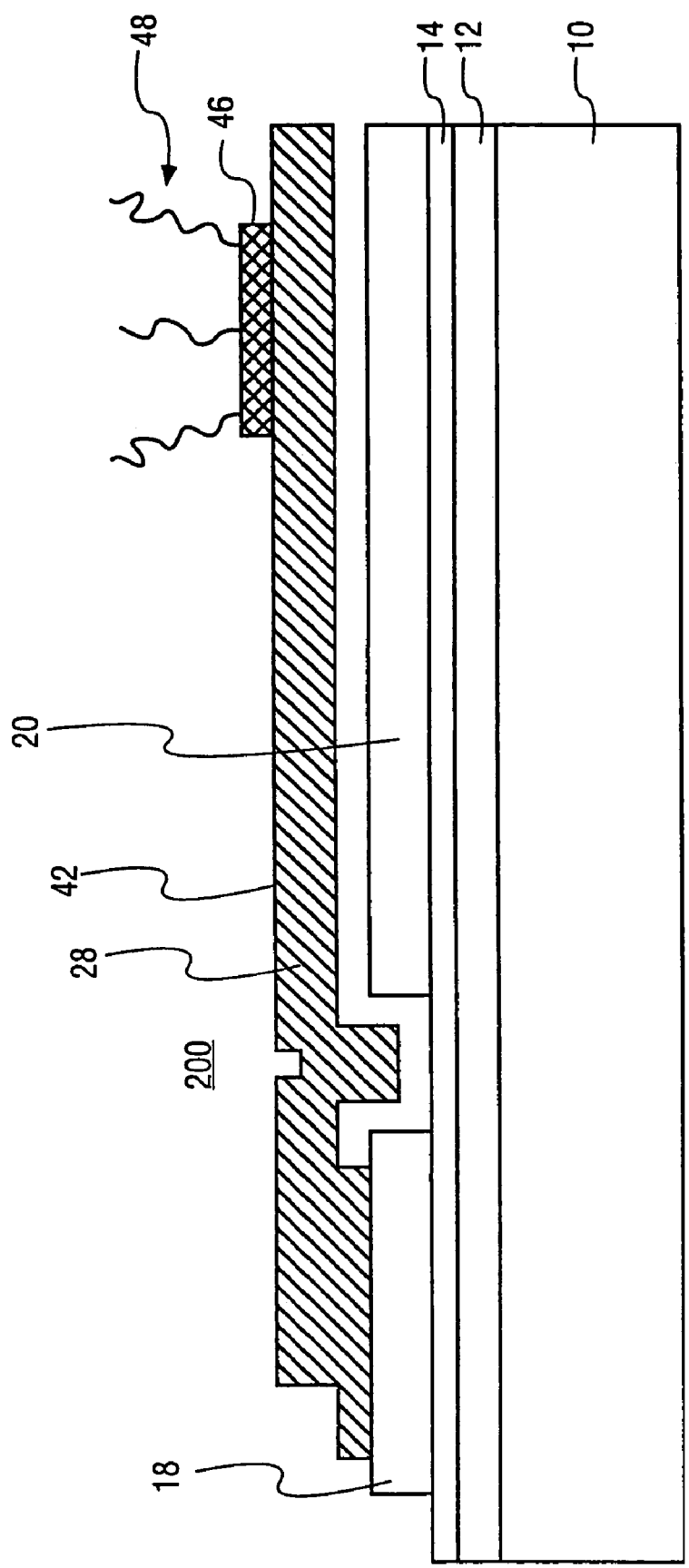
FIG. 14 is an elevational cross-section view that depicts alternative processing.

FIG. 14 illustrates another embodiment of the present invention. In this embodiment, an oscillator 200 includes a sacrificial oxide layer 22 to support the oscillator member 28. This embodiment represents a passive or static tuning of oscillator 200. Bulk material 46 is added to oscillator 200 by the use of a radiant energy source 48 such as a laser or a focused ion beam (FIB) in the presence of a deposition vapor. Bulk material 46 acts to deposit upon upper surface 42 at the conjunction of the deposition vapor, the radiant energy source 48, and upper surface 42. In this manner, bulk material 46 is added by directing radiant energy source 48 over a preferred amount of upper surface 42. Bulk material 46 may be a compound such at $SiO_2$ formed from the thermal decomposition of tetraethyl ortho silicate (TEOS). It may also be a metal such as tungsten (W), chromium (Cr), cobalt (Co), nickel (Ni), platinum (Pt), alloys thereof, combinations thereof, and the like. Although not depicted, it is understood that where necessary to protect oscillator member 28 during the formation of bulk material 46, a protective layer such as protective layer 30 may be formed upon upper surface 42.

Figure 15:
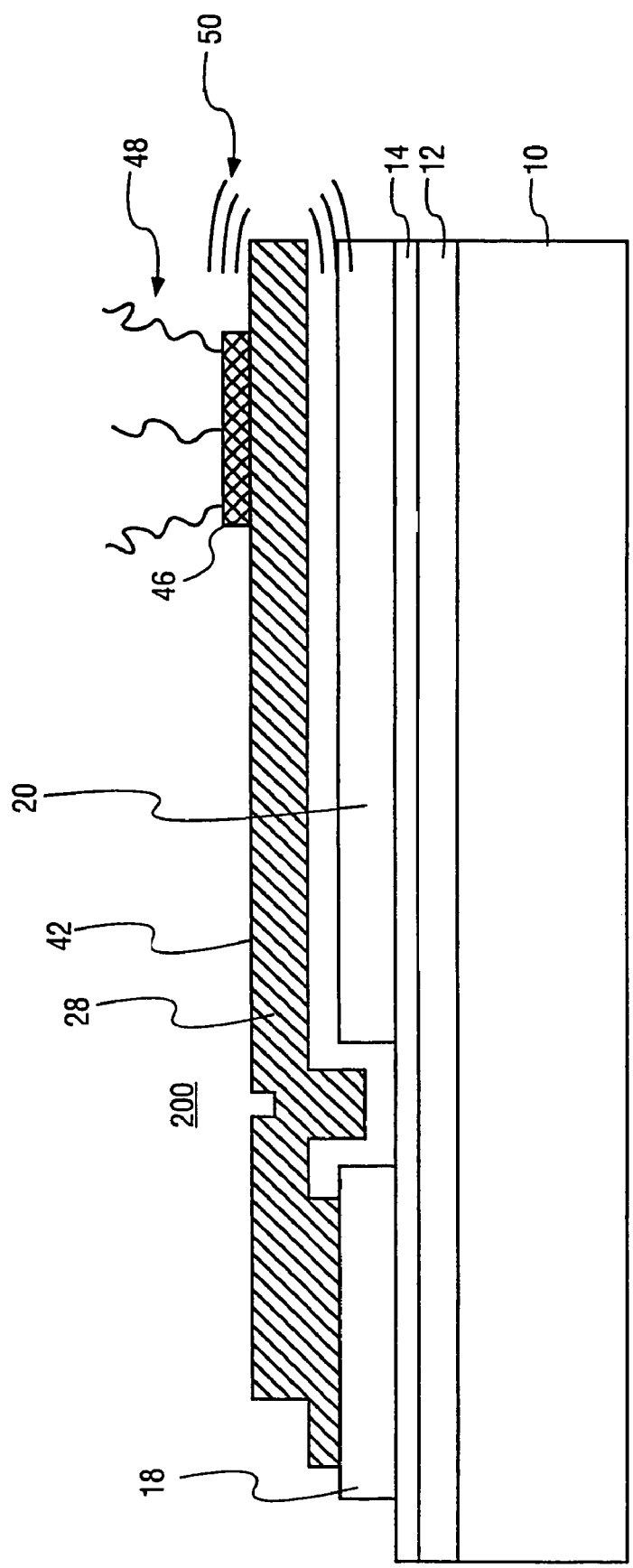
FIG. 15 is an elevational cross-section view that depicts alternative processing.

In another embodiment, the active or dynamic tuning of oscillator 200 is carried out as illustrated in FIG. 15. Sacrificial oxide layer 22 has been removed, oscillator 200 is in motion 50, and radiant energy source 48 is building a bulk material 46 while the frequency of oscillator 200 is being monitored. As the vapor impinges oscillator 200, the vapor forms condensate and/or a precipitate that is deposited by such mechanisms as decomposition of the vapor into an at least in part non-volatile portion. The conditions that are sufficient to cause the impinging vapor to deposit to form bulk material 46 may be practiced according to known methods of laser or FIB deposition techniques. Such conditions may also be selected from either the preferred CVD processes or from PVD processes.

In any event, an empirical process may include determining a first resonant frequency of oscillator 200, patterning at least one structure such as ablative structure 40 (subtractive patterning) or bulk material 46 (additive patterning) on oscillator upper surface 42, and then determining a second resonant frequency of oscillator 200. Alternatively, the inventive method may include continuously monitoring the resonant frequency of oscillator 200 as it changes from the first frequency to the second frequency by continuously vibrating the oscillator 200 while patterning.

The inventive oscillator is typically a component that may be placed in an electronic device such as a handheld and/or wireless device. Such handheld and/or wireless devices may include a personal data assistant (PDA), a cellular telephone, a notebook computer, and the like. The inventive oscillator is also typically placed in an electronic device such as a storage device including a magnetic storage device and the like where the oscillator may be a read/write structure.

Figure 16:
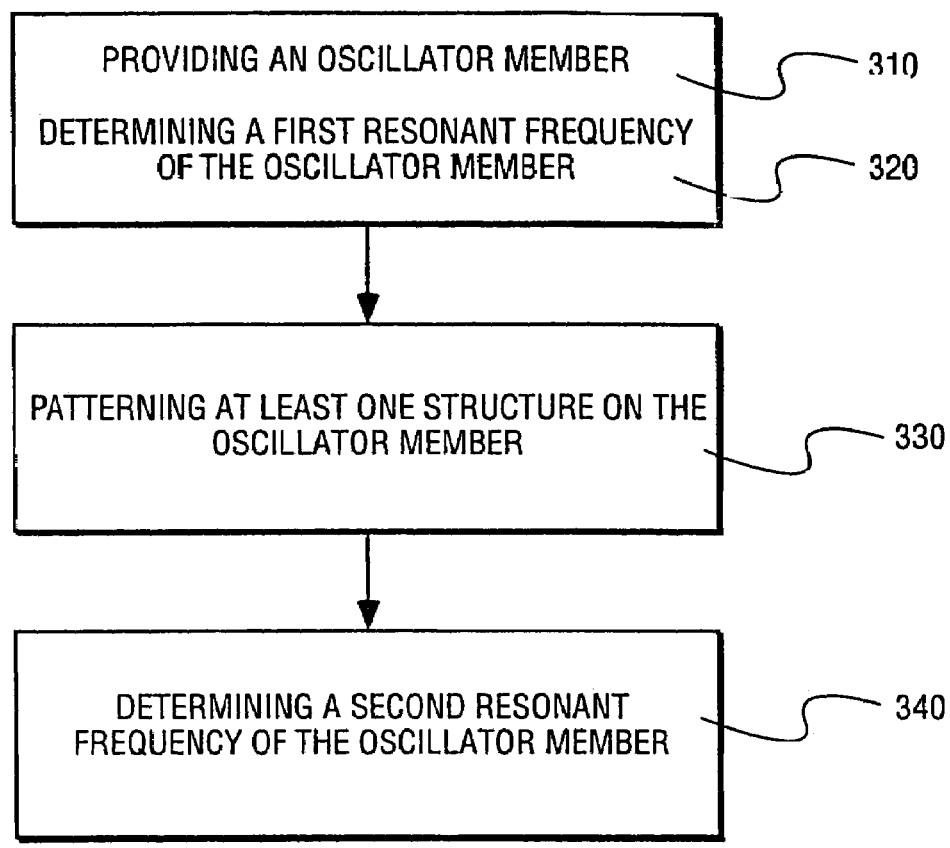
FIG. 16 is a process flow chart according to the present invention.

FIG. 16 illustrates the inventive process 300. First, an oscillator is provided 310 that includes an oscillator member. A first resonant frequency of the oscillator member is determined 320. Next, at least one structure is patterned 330 on the oscillator member. This patterning is either subtractive, additive or both. Next, a second resonant frequency of the oscillator member is determined 340.

In one embodiment of the present invention, because of both passive and active patterning techniques, either or both of which can be additive or subtractive, an oscillator may be tuned to meet a preferred application. It will become clear that both subtractive and additive techniques may be combined such that the subtractive technique acts as a discrete stage tuning where a slight overshoot may occur, and then the additive technique acts as a continuous tuning to bring the preferred resonant frequency closer to the preferred number. Control of the additive technique may be dominated by the presence and physical state of the deposition vapor where adjustment of a laser or an FIB may lack the needed sensitivity to achieve a preferred resonant frequency. In other words, the subtractive technique approaches a digital adjustment to a preferred resonant frequency for an oscillator, and the additive technique approaches an analog adjustment to the preferred resonant frequency.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A micro resonator comprising:
   an oscillator member comprising a vibrating portion supported by a pedestal; and
   an ablative structure disposed on the vibrating portion, the ablative structure comprising a pattern of spaced-apart stacks, each spaced-apart stack being separated from the oscillator member by a protective pad.

2. The micro resonator according to claim 1 wherein the protective pad is made from aluminum, an aluminum alloy, silver, a silver alloy, indium, or an indium alloy.

3. The micro resonator according to claim 1 wherein the protective pad is made from a refractory metal, a refractory metal oxide, a refractory metal silicide, a refractory metal nitride, or combinations thereof.

4. The micro resonator according to claim 1 wherein the oscillator member is made of a material selected from polysilicon, a metal, a metal nitride, a metal oxide, a metal silicide, or combinations thereof.

5. A microresonator system comprising:
   a microresonator having an input and an output and comprising:
      an oscillator member comprising a vibrating portion suspended above a substrate by a pedestal,
      a drive electrode positioned between the vibrating portion and the substrate,
      an ablative structure disposed on the vibrating portion, the ablative structure comprising a pattern of spaced-apart stacks, each spaced-apart stack being separated from the oscillator member by a protective pad;
   an input circuit connected to the input; and
   an output circuit connected to the output.

6. The micro resonator according to claim 5 wherein the protective pad is made from aluminum, an aluminum alloy, silver, a silver alloy, indium, or an indium alloy.

7. The micro resonator according to claim 5 wherein the protective pad is made from a refractory metal, a refractory metal oxide, a refractory metal silicide, a refractory metal nitride, or combinations thereof.

8. The micro resonator according to claim 5 wherein the oscillator member is made of a material selected from polysilicon, a metal, a metal nitride, a metal oxide, a metal suicide, or combinations thereof.

* * * * *